United States Patent [19]

Lindmayer

[11] Patent Number: 4,822,520

[45] Date of Patent: Apr. 18, 1989

[54] PHOTOLUMINESCENT MATERIALS FOR OUTPUTTING BLUE-GREEN LIGHT

[75] Inventor: Joseph Lindmayer, Potomac, Md.

[73] Assignee: Quantex Corporation, Rockville, Md.

[21] Appl. No.: 34,333

[22] Filed: Apr. 3, 1987

Related U.S. Application Data

[63] Continuation of Ser. No. 870,809, Jun. 6, 1986, which is a continuation-in-part of Ser. No. 786,095, Oct. 10, 1985, Pat. No. 4,705,952.

[51] Int. Cl.$^4$ .................... B05D 5/06; C09K 11/08
[52] U.S. Cl. ........................... 252/301.4 S; 427/64; 252/301.4 H
[58] Field of Search .................. 427/64, 71, 66; 252/301.4 S, 301.4 H, 301.6 S

[56] References Cited

U.S. PATENT DOCUMENTS

| | | | |
|---|---|---|---|
| 2,468,452 | 4/1949 | Leverenz | 252/301.4 S |
| 2,468,714 | 4/1949 | Leverenz | 252/301.4 S |
| 2,485,903 | 10/1949 | Miller | 252/301.4 S |
| 2,521,124 | 9/1950 | Miller | 252/301.4 S |
| 2,522,074 | 9/1950 | Urbach | 252/301.4 |
| 2,527,365 | 10/1950 | Leverenz | 252/301.4 S |
| 2,979,467 | 4/1961 | Keller | 252/301.4 S |
| 3,668,142 | 6/1972 | Luckey | 252/301.4 S |
| 3,767,588 | 10/1973 | Otomo et al. | 252/301.4 H |
| 4,064,066 | 12/1977 | Toshinal et al. | 252/301.4 H |
| 4,507,562 | 5/1985 | Gasiot et al. | 250/484.1 |
| 4,510,174 | 3/1985 | Holzapfel et al. | 427/77 |
| 4,517,463 | 5/1985 | Gasiot et al. | 250/327.5 |

FOREIGN PATENT DOCUMENTS

85/00089 4/1985 PCT Int'l Appl. .

OTHER PUBLICATIONS

Keller et al, "Studies in Some IR Stimulable Phosphors", *Phys. Rev.* vol 108 #3, Nov. 1, 1957, pp. 663–676.

J. Lindmayer, "IR Phosphors as Sensors", *Sensors*, 3/86.

Mims, "How to see Near-IR Radiation", *Modern Electronics* 5/85, pp. 64–70.

*Primary Examiner*—Norman Morgenstern
*Assistant Examiner*—Marianne L. Padgett
*Attorney, Agent, or Firm*—Ostrolenk, Faber, Gerb & Soffen

[57] ABSTRACT

Photoluminescent materials useful for detection of infrared light are prepared using a base material, first and second dopants, barium sulfate and a fusable salt. The base material is an alkaline earth metal sulfide or selenide such as strontium sulfide. Barium sulfate is used to increase the brightness of output light, whereas lithium fluoride is used to allow the material to be fused together. Samarium and cerium oxide are used in specific examples as the first and second dopants for providing electron traps. The photoluminescent material is made according to a process involving heating of the material to a fusing temperature, grinding the material after cooling, and reheating the material to below the fusing temperature, but sufficiently high to repair the crystal surfaces. The material is then placed in a transparent binder and applied to a substrate.

14 Claims, 2 Drawing Sheets

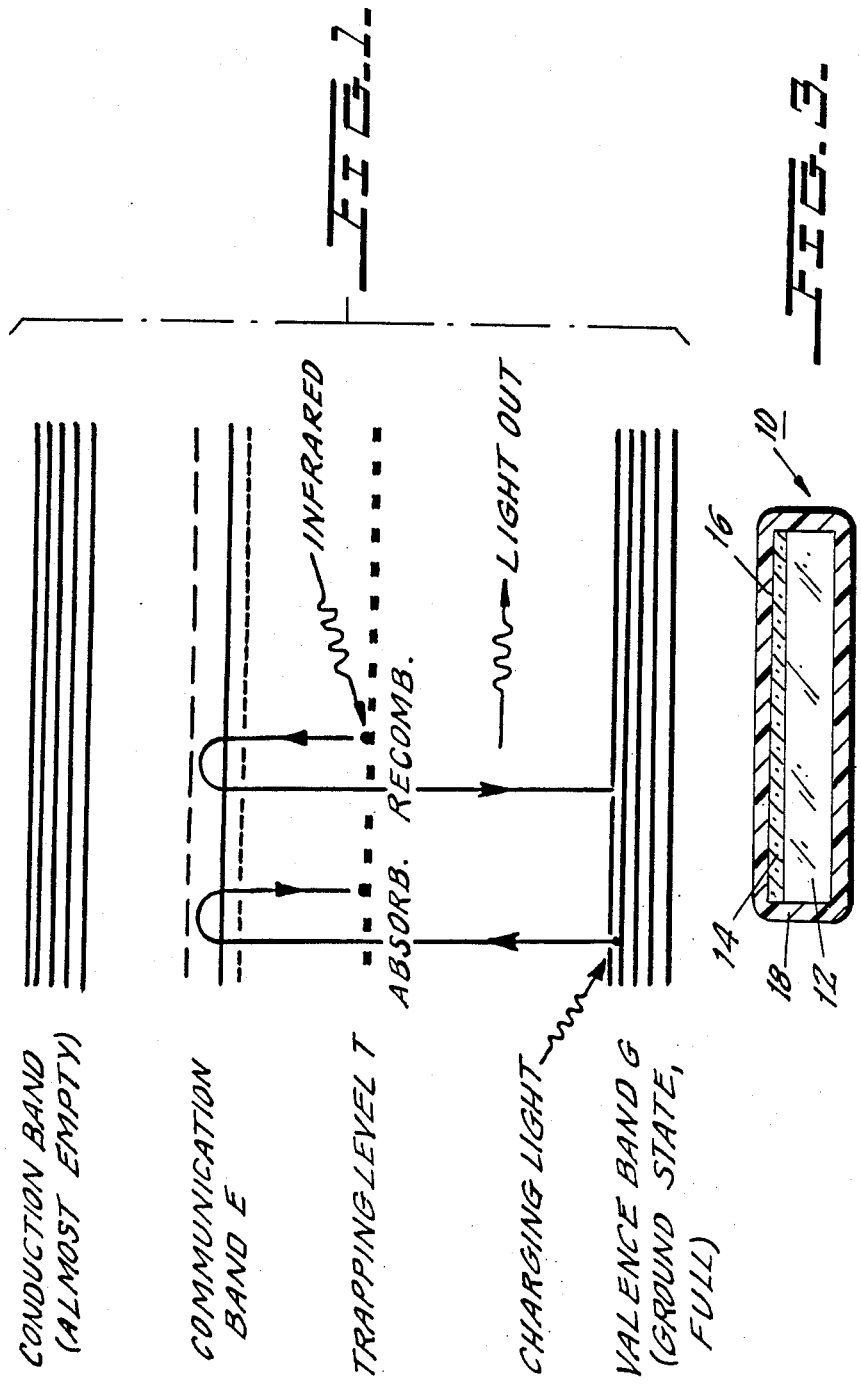

PHOTOLUMINESCENT MATERIALS FOR OUTPUTTING BLUE-GREEN LIGHT

CROSS-REFERENCE TO RELATED APPLICATIONS

This application is a continuation of U.S. patent application Ser. No. 870,809 filed June 6, 1986, which is a continuation-in-part of U.S. patent application Ser. No. 786,095 filed Oct. 10, 1985 now U.S. Pat. No. 4,705,952.

This application discloses materials which are useful for optical memories as described in the present inventor's U.S. patent application Ser. No. 870,877 filed June 5, 1986 and assigned to a common assignee.

This application is related to the present inventor's U.S. patent applications Ser. No. 034,332, 034,334, and 034,497 filed on even date herewith and entitled respectively Photoluminescent Materials For Outputting Orange Light and A Process For Making The Same, Infrared Sensing Device Outputting Orange Light and A Process For Making the Same, and Infrared Sensing Device Outputting Blue-Green Light and A Process For Making the Same.

BACKGROUND OF THE INVENTION

This invention relates to electron trapping optical material and a process for making and using such material.

In order to define the family of materials involved, it is useful to review the history, particularly since sometimes confusion exists over terminology. It is important to begin with the term luminescence, the ability to certain solids to emit light under different conditions.

Luminescence is a long known phenomenon of nature reaching back very far in history. Recorded observations reach back to the last century. Seeback and Becquerel observed momentary visible afterglow in certain materials. In 1889, Klatt and Lenard also observed some effects with infrared. During this time period, words like "phosphor" and "luminescence" appeared. In 1904, Dahms distinguished between "stimulation" and "quenching"; meaning inducing or stopping afterglow. Much of the later work is associated with Lenard, who received the Nobel Prize in 1905 in physics for cathode ray emission. He studied different phosphors until at least 1918. Later work can be found by Urbach in 1926 through 1934. These early scientists basically observed very small luminescent effects.

In 1941, a program was instituted by the National Defense Research Committee for development of light emitting phosphors. The work started at the University of Rochester, and other laboratories became involved; however, the projects ended with World War II. The following technical papers were published on this work between 1946 and 1949:

B. O'Brien, "Development of Infrared Phosphors", *J. Opt. Soc. of Am.*, vol. 36, July 1946, p. 369;

F. Urbach, et al., "On Infra-Red Sensitive phosphors", *J. Opt. Soc. of Am.*, vol. 36, July 1946, p. 372;

G. Fonda, "Preparation and Characteristics of Zinc Sulfide Phosphors Sensitive to Infra-Red", *J. Opt. Soc. of Am.*, vol. 36, July 1946, p. 382;

A. L. Smith, "The Preparation of Strontium Selenide and its properties as a Base Material for Phosphors Stimulated by Infra-Red", *Journal of the Am. Chem. Soc.*, vol. 69, 1947, p. 1725; and K. Butler, "Emission Spectra of Silicate Phosphors with Manganese Activation", *Journal of the Electrochemical Society*, vol. 93, No. 5, 1948, p. 143.

These papers provide a confusing story on the materials studied. As decades went by, the effects were forgotten by most physicists. Only work in the field of cathodoluminescence for screens of cathode ray tubes and fluorescent lamps continued.

Thus, the field of luminescence is broad and refers to the ability of certain solids (and liquids) to emit light when driven by and external energy source. When the driving evergy source is light, the proper term is photoluminescence.

There is yet another interesting class of materials which upon excitation by illumination can store electrons in "traps" for varying lengths of time as discussed by J. L. Summerdijk and A. Bril, in "Visible Luminescence . . . Under IR Excitation", International Conference on Luminescence, Leningrad, August 1972, p. 86. In the case of deep traps, trapped electrons can be released at a later time by photons having an energy similar to the depth of the trap. Thermal discharging is negligible in the case of deep traps. Under these circumstances, it appears that light has been "stored" for later use and emission of visible light can be activated by infrared. In the case of shallow traps, spontaneous emission will occur at room temperature because the thermal agitation is sufficient to excite electrons out of the traps. These materials are now called electron trapping optical materials.

The fundamentals of electron trapping material are the following: A host crystal is a wide bandgap semiconductor (II–VI compound), normally without any special value. These crystals, however, can be doped heavily with impurities to produce new energy levels and bands. Impurities from the lanthanide (rare earth) series are readily accomodated in the lattice and form a "communication" band and a trapping level. The communication band replaced the original conduction band and provides an energy level at which the electrons may interact. At lower energies the trapping level represents non-communicating sites.

Materials that contain sites where luminescent activity occurs often include one or more types of these sites where electrons may be trapped in an energized state. Upon application of suitable wavelengths of energizing radiation such as visible light or x-rays, such sites produce free energized electrons. The free electrons are raised to an energized state within a communication band where transitions such as absorption and recombination may take place. Upon removal of the energizing radiation, the free electrons may be trapped at an energy level higher than their original ground state or may drop back to their original ground state. The number of electrons that become trapped is very much dependent upon the composition of the photoluminescent material and the dopants used therein.

If the trapping level is sufficiently below the level of the communication band, the electron will be isolated from other electrons and will remain trapped for a long period of time, and will be unaffected by normal ambient temperature. Indeed, if the depth of the trap is sufficient, the electron will remain trapped almost indefinitely unless the electron is energized by energy from light, other electromagnetic energy, or thermal energy much higher than room temperature.

The electron will remain trapped until light or other radiation is applied to provide sufficient energy to the electron to again raise its energized state to the communication band where a transition may take place in the form of recombination allowing the electron to escape from the trap and release a photon of visible light. The material must be such that room temperature thermal energy is insufficient to allow any significant portion of trapped electrons to escape from their traps. As used herein, "optical energy" shall include visible light, infrared light, and ultraviolet light unless otherwise noted, "photoluminescent material" is a material that exhibits the above characteristics.

Although various photoluminescent materials have heretofore been known, the properties of such materials have often been less than desirable. For example, photoluminescent materials have been used for locating infrared beams by outputing visible light upon placement of the material within an infrared beam, but such previous photoluminescent materials are not sensitive enough to detect relatively low levels of infrared radiation. The visible light output by such materials is often at a very low level such that detection of the visible light is difficult. Further, such materials commonly have electron traps with insufficient depth and/or a relatively low density of electron traps such that it is difficult to maintain the electrons trapped for extended periods of time. The ratio of the energy of light input to energy of light output in such materials is often quite high. That is, a relatively large amount of energy must be put into the material to provide a given output optical energy. The development of photoluminescent materials that avoid or minimize the disadvantages discussed above would open up numerous other applications for such materials.

OBJECTS AND SUMMARY OF THE INVENTION

A primary object of the present invention is to provide new photoluminescent materials avoiding or minimizing the disadvantages discussed above.

A more specific object of the present invention is to provide photoluminescent materials having sufficient electron trap depth and sufficient density of electron traps to be useful as an optical memory material.

Another object of the invention is to provide a photoluminescent material that outputs a blue-green light when subjected to infrared radiation.

Yet another object of the present invention is to realize a new and improved process for making photoluminescent materials.

The above and other objects of the present invention, which will become more apparent as the description proceeds, are realized by an electron trapping photoluminescent material consisting essentially of a base material, a first dopant, a second dopant, barium sulfate, and a fusable salt. More specifically the photoluminescent material comprises: a base material selected from a group of alkaline earth metal sulfides and alkaline earth metal selenides; a first dopant of samarium; a second dopant of cerium oxide; up to 10 parts of barium sulfate for every 100 parts of base material; and up to 10 parts fusable salt for every 100 parts of base material.

The invention further comprises the photoluminescent material described above disposed upon a substrate. If desired, the photoluminescent material may be applied upon the substrate by use of a transparent binder. Mixing the transparent binder into the photoluminescent material will not significantly affect the optical properties of the photoluminescent material. Reference in this application to "consists essentially of the base material, first dopant, second dopant, barium sulfate, and fusable salt" shall be interpreted as including those materials alone or in combination with a transparent binder.

The process of the present invention comprises the steps of mixing a base material, a first dopant of samarium, and a second dopant; after mixing, heating the resultant mixture to a first temperature sufficient to fuse the mixture into crystalline form; after heating, grinding the resultant crystalline form into a powder; and after grinding, reheating the resultant powder to a second temperature below the first temperature but, sufficiently high to repair crystal edges of the powder, thereby yielding an electron trapping optical material without fusing the powder into a mass. The first heating step takes place in a furnace with an inert atmosphere and a temperature above 950° C. The grinding step yields a powder having particle sizes of 100 microns or less. The process may further include a step of mixing the optical material with a transparent binder and applying it to a substrate.

DESCRIPTION OF THE DRAWINGS

The above and other features of the present invention will be more readily understood when the following detailed description is considered in conjunction with the accompanying drawings wherein like characters represent like parts throughout the several views and in which:

FIG. 1 is a schematic illustrating the principle of operation of the present invention.

FIG. 3 shows a crossection of photoluminescent material disposed on a substrate.

DETAILED DESCRIPTION

Figure 4:
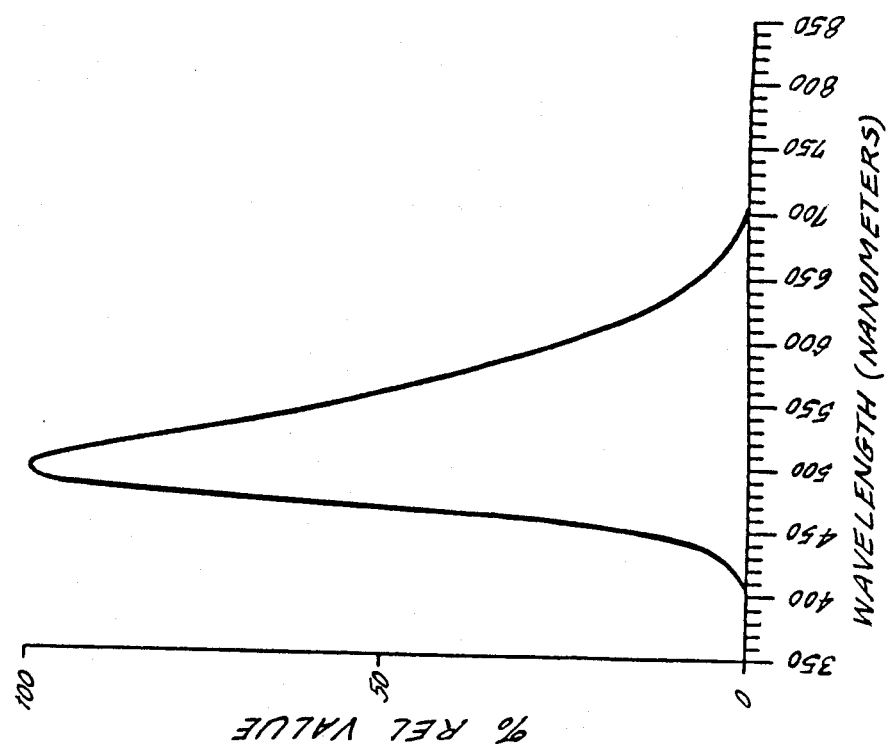
FIG. 4 shows a spectrum of output light from a second optical material according to the present invention.

FIG. 1 shows the principles of operation of the present invention. The basic crystalline photoluminescent material used has a valence band G full of electrons at a ground state. The material is subjected to visible light which functions to energize certain electrons in the valence band G. An electron shown on the left is originally in a valence band G and is subjected to visible charging light. The electron absorbs a photon raising its energy level to a communication band E where communication takes place with other energized electrons resulting in transitions. Upon removal of the energizing light, the electron may drop back to a trapping level T or back to the valence band G depending upon the composition of the material and available trapping sites. The electron, if in the trapping level T, will remain isolated from other electrons and trapped until sufficient additional energy is provided to the electron to raise its energy back up to the communication band E.

As shown on the right side of FIG. 1, an electron may be stimulated by infrared electromagnetic energy to move it back to the communication band E where it may interact with other electrons and undergo recombination causing it to move back to the valence band G and out put a photon of visible light in the process. The materials of the present invention work upon the principle illustrated by FIG. 1 whereby light may be "stored" by the phenomenon of electron trapping and the light may be freed by application of infrared radiation to push the electron up above the trap and allow it to return to the valence band. The number of trapping sites, the depth of the traps and the probability of transitions occurring in the communication band are all dependent upon the composition of the photoluminescent material used.

As previously mentioned the photoluminescent material of the present invention comprises a base material, a first dopant, and a second dopant. Barium sulfate is preferably added to improve light output and a fusable salt such as lithium fluoride is useful in certain embodiments.

The base material may be selected from the group of alkaline earth metal sulfides and alkaline earth metal selenides such as strontium sulfide. The first dopant is samarium and the second dopant is selected from the group of europium oxide, europium fluoride, europium chloride, europium sulfide, and cerium oxide depending upon the desired output light color.

EXAMPLE 1

A photoluminescent material for outputting orange light is made from a mixture having the following composition:

| | | |
|---|---|---|
| Strontium sulfide | 100 | parts |
| Barium sulfate | 5.5 | parts |
| Lithium fluoride | 5.5 | parts |
| Samarium | 150 | parts per million |
| Europium oxide | 550 | parts per million |

As used above and throughout this application, "parts" and "parts per million" shall refer to parts by weight unless otherwise noted.

The mixture is placed into a graphite crucible within a furnace flushed with a dry nitrogen atmosphere (derived from a liquid source) or other dry inert atmosphere such as argon, and heated to between 1150° C. and 1300° C. (preferably 1200° C.) for 30 minutes to one hour such that a fused mass is formed. For longer heating times, the fused mass could be formed at temperatures as low as 950° C. Temperatures as high as 2000° C. could be used to form such a fused mass in shorter times.

After cooling, the fused mass is ground using standard techniques into a fine powder having a particle size of 1 to 10 microns if the material is to be used for optical memory material. If the material is to be used for an infrared sensing card or for an optical viewing screen which requires less resolution, the fused mass may be ground to between 10 and 100 microns. The particle size could be larger for large screens, which screens would generate visible images from infrared light. A particle size of 2 microns or less is preferable if thin film techniques are to be used.

After grinding, the powdered material is heated to about 300° C. to 700° C. (preferably 600° C.) in the graphite crucible within the nitrogen or other inert atmosphere furnace. This second heating is below the fusing temperature of the material (about 700° C.) and is maintained for 10 to 60 minutes (preferably 30 minutes). This second heating step removes internal stresses and repairs damage done to the crystalline surfaces during the grinding step.

After the second heating, the material is cooled and the powdered material is then mixed with a suitable binder or vehicle such as acrylic, polyethylene, or other organic polymer.

After the material has been mixed with a transparent binder, it is applied as a thin coating to a substrate. The coating of the photoluminescent material upon the substrate will preferably be between 1 micron and 500 microns in thickness. Depending upon the use to be made of the material, the substrate may be clear plastic, aluminum oxide, glass, paper, or most any other solid substance.

In the above mixture, the strontium sulfide serves as a base material whereas the lithium fluoride operates to provide the fusability characteristics useful for the specific embodiment. Alternatively, other alkaline metal sulfides and alkaline earth metal selenides might be used as the base material.

The barium sulfate in the above mixture is used to improve the brightness of output light from the material. Preferably 5.5 parts are used as noted above, but between 1 and 10 parts may be used of the barium sulfate as well as between 1 and 10 parts of lithium fluoride relative to the 100 parts of strontium sulfide. The barium sulfate is not absolutely essential, but will greatly improve the optical characteristics of the material.

The samarium and europium oxide in the above mixture are used for establishing the communication band and the electron trapping level. Preferably 150 parts per million of samarium are used, but the samarium could alternately be between 50 parts per million and 300 parts per million. The europium oxide may be between 300 and 800 parts per million with 400 and 600 parts per million being preferred and 550 parts per million being the optimal value. Europium fluoride, europium chloride, or europium sulfide could be used in lieu of europium oxide.

Figure 2:
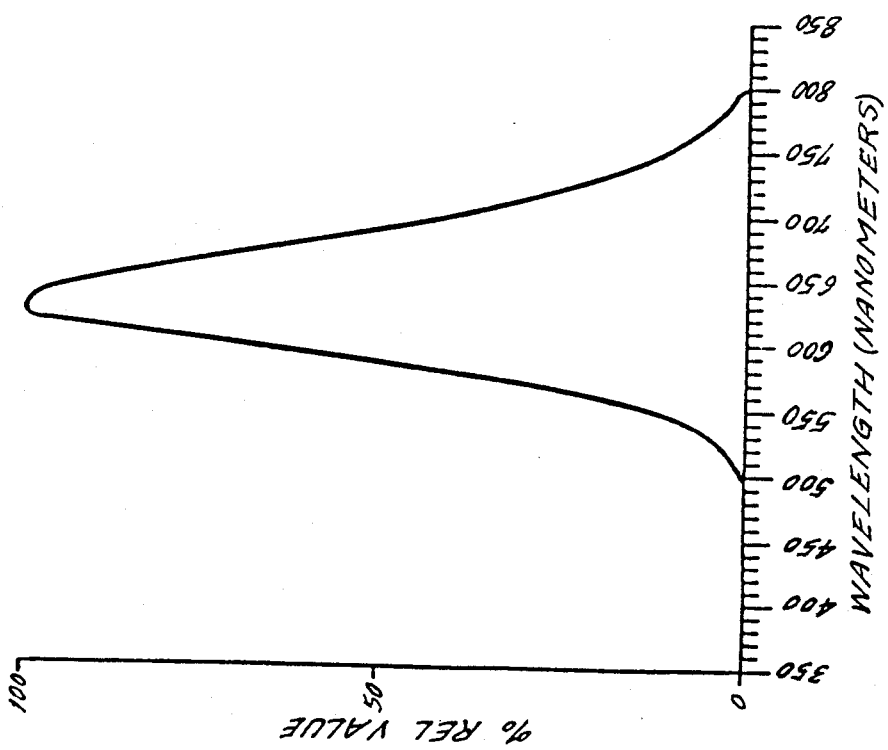
FIG. 2 shows the spectrum of light output by a first optical material.

The mixture resulting from the above process provides a depth for electron traps of 1.2 electron volts below the communication band and has an output spectrum as shown in FIG. 2 which illustrates that the center frequency of the output has a wavelength of approximately 620 nanometers corresponding to an orange light.

FIG. 3 shows the photoluminescent material disposed on a substrate forming a device 10. As illustrated, the device 10 is a card shown in vertical section having a substrate 12 and the photoluminescent material 14 applied with a transparent binder to the substrate 12. The substrate 12 may be paper, aluminum oxide, plastic, such as PVC, or other solid material. The substrate may be transparent or opaque, if opaque, a reflective surface or light color is preferred. The material 14 establishes a planar surface 16. An optional transparent coating 18 may encapsulate the material 14 and substrate 12.

The card, or device 10, of FIG. 3 is useful for aligning scientific or industrial instrumentation having infrared beams. In operation, the card 10 may be "charged up" by exposure of the photoluminescent material 14 to a strong visible light such that electrons will be charged and trapped. The card 10 may then be placed in front of an infrared light source. The photoluminescent material 14 will out put a visible light at the place where the infrared beam strikes the material, thereby allowing the user to identify exactly where the otherwise invisible beam of infrared radiation is located. Accordingly, the card 10 may be used to calibrate scientific or industrial instruments.

Advantageously, the material of Example 1 and other materials discussed in this application provide a relatively high output light intensity upon stimulation by infrared radiation such that the card can be used with a background of visible light. The light output by the freed electrons in the photoluminescent material 14 will be visible despite the background light. A screen for displaying infrared information as visible light patterns can be made by the same process.

EXAMPLE 2

A second photoluminescent material for outputting blue-green light may be made with the following composition:

| | |
|---|---|
| Strontium sulfide | 100 parts |
| Barium sulfate | 5 parts |
| Lithium fluoride | 10 parts |
| Samarium | 100 parts per million |
| Cerium oxide | 1200 parts per million |

The above mixture is processed in the same manner as that of Example 1 by first heating to fusing, grinding the resultant fused mass, and then reheating at a temperature below the fusing temperature but sufficiently high to allow repair of damage to the crystalline parts. Cooling may be used after each of the heating and reheating steps. The same process steps, in terms of temperature and time intervals, may be used in processing this second material. The resulting powder may be ground as with Example 1, combined with a transparent binder or vehicle, and applied to a substrate to realize a card or device for infrared sensing as illustrated by 10 in FIG. 3.

In the above mixture, the barium sulfate may vary from zero up to 10 parts, the lithium fluoride may vary between 2 and 10 parts, the samarium may vary between 50 and 200 parts per million, and the cerium oxide may vary between 300 and 1500 parts per million. The specific values for portions which are given above provide highly superior characteristics such as sensitivity. The second material may be charged up very quickly with visible light. The material may hold the charge for extended periods of time similar to the first material and will trigger re-emission of visible light with a wavelength of about 500 nanometers (blue-green light) upon application of an infrared source. The emission spectrum under IR stimulation is illustrated in FIG. 4.

EXAMPLE 3

A photoluminescent material is made according to the ingredients and the process of Example 2 above except that the mixture is heated for 2 hours in the fusing step. The output spectrum of the photoluminescent material will be essentially the same as FIG. 4, but the material is different from Example 2 in that the extended fusing step extends the infrared sensitivity to longer wavelengths.

EXAMPLE 4

A photoluminescent material is made having the following composition:

| | |
|---|---|
| Strontium sulfide | 100 parts |
| Barium sulfate | 5.5 parts |
| Samarium | 150 parts per million |
| Europium oxide | 550 parts per million |

The listed materials (within ranges specified for Example 1 above) are deposited upon a substrate of aluminum oxide by any known techniques including physical deposition (evaporation, sputtering, etc.) or chemical vapor deposition, gaseous diffusion, ion beam deposition, molecular beam deposition, and electron beam deposition. The materials and substrate are placed into a furnace and fused under the condition of Example 1. The material fuses without the use of the lithium fluoride of Example 1. Because the photoluminescent material bonds so well to the aluminum oxide substrate, the use of separate binders or vehicles is not necessary.

The structure resulting from the fusing step may optionally be encapsulated in clear plastic to realize the device 10 of FIG. 3. No grinding or reheating is necessary. The process of Example 4 may be applied to an aluminum oxide disc to provide an optical memory that could likewise be coated by clear plastic.

The process of Example 4 could be used with the starting materials of Example 2 except that lithium fluoride would not be used. The fusing step could be accomplished under the conditions of Example 1 or Example 3. As with Examples 1, 2, and 3, the use of barium sulfate is not absolutely essential, but greatly improves the optical characteristics of the material.

The substrate for Example 4 could be aluminum oxide in the form of sapphire or ruby in which case the layer of optical material could be as thin as 0.5 microns resulting in a micro crystalline form of the optical material.

The optical materials of the present invention may be used for IR sensing and/or as a memory by using their electron trapping characteristics. The materials may be used in crystal form (i.e., the form in Examples 1, 2, and 3 before grinding), powder form (Examples 1, 2, and 3 after grinding), and micro crystalline form (Example 4).

Although various specific details have been discussed herein, it is to be understood that these are for illustrative purposes only. Various modifications and adaptions will be apparent to those skilled in the art. Accordingly, the scope of the present invention should be determined by reference to the claims appended hereto.

What is claimed is:

1. An electron trapping photoluminescent material, comprising:
    a base material comprising subtantially strontium sulfide;
    a first dopant of samarium provided in a quantity of between 70 to 300 parts per million by weight; and
    a second dopant of cerium oxide provided in a quantity of between 600 to 1500 parts per million by weight.

2. The photoluminescent material of claim 1, further comprising barium sulfate.

3. The photoluminescent material of claim 2, further comprising a fusable salt.

4. The photoluminescent material of claim 3, wherein said fusable salt comprises lithium fluoride.

5. The photoluminescent material of claim 3, wherein the fusable salt is provided in a quantity of up to 10 parts by weight per 100 parts by weight of base material.

6. The photoluminescent material of claim 2, wherein barium sulfate is provided in a quantity of 1 to 10 parts by weight for every 100 parts by weight of base material.

7. The photoluminescent material of claim 1, further comprising a fusable salt.

8. The photoluminescent material of claim 7, wherein said fusable salt comprises lithium fluoride.

9. The photoluminescent material of claim 7, wherein the fusable salt is provided in a quantity of up to 10 parts by weight per 100 parts by weight of base material.

10. The photoluminescent material of claim 1, wherein said base material comprises strontium sulfide.

11. The photoluminescent material of claim 1, wherein the base material is strontium sulfide, and the photoluminescent material additionally comprises barium sulfate and lithium fluoride.

12. The photoluminescent material of claim 1, wherein second dopant comprises 1150-1250 parts per million by weight cerium oxide and the samarium is provided in a quantity of 70-200 parts per million by weight.

13. The photoluminescent material of claim 1, wherein the second dopant comprises 1150-1250 parts per million by weight cerium oxide.

14. The photoluminescent material of claim 1, wherein the base material is strontium sulfide, the first dopant, samarium, is provided in a quantity of between 70-200 parts per million by weight, and the second dopant, cerium oxide, is provided in a quantity of between 1150-1250 parts per million by weight.

* * * * *